United States Patent
Schicktanz

(10) Patent No.: US 10,629,844 B2
(45) Date of Patent: Apr. 21, 2020

(54) ORGANIC OPTOELECTRONIC COMPONENT AND METHOD FOR PRODUCING AN ORGANIC OPTOELECTRONIC COMPONENT

(71) Applicant: OSRAM OLED GmbH, Regensburg (DE)

(72) Inventor: Simon Schicktanz, Regensburg (DE)

(73) Assignee: Osram OLED GmbH, Regensburg (DE)

( * ) Notice: Subject to any disclaimer, the term of this patent is extended or adjusted under 35 U.S.C. 154(b) by 0 days.

(21) Appl. No.: 15/768,571

(22) PCT Filed: Oct. 20, 2016

(86) PCT No.: PCT/EP2016/075227
§ 371 (c)(1),
(2) Date: Apr. 16, 2018

(87) PCT Pub. No.: WO2017/068041
PCT Pub. Date: Apr. 27, 2017

(65) Prior Publication Data
US 2018/0301661 A1    Oct. 18, 2018

(30) Foreign Application Priority Data

Oct. 21, 2015    (DE) .................. 10 2015 117 932

(51) Int. Cl.
*H01L 51/52*    (2006.01)
*H01L 51/44*    (2006.01)
(Continued)

(52) U.S. Cl.
CPC .......... *H01L 51/5253* (2013.01); *B32B 3/266* (2013.01); *B32B 7/06* (2013.01);
(Continued)

(58) Field of Classification Search
CPC . H01L 51/448; H01L 51/524; H01L 51/5253; H01L 51/5256; H01L 51/0024;
(Continued)

(56) References Cited

U.S. PATENT DOCUMENTS

2001/0027876 A1* 10/2001 Tsukamoto ......... H01L 21/6835
                                                          174/260
2010/0014162 A1    1/2010 Bunde et al.
(Continued)

FOREIGN PATENT DOCUMENTS

DE    19733510 A1 *  4/1998  .............. C09J 7/403
DE    19733510 A1    4/1998
(Continued)

OTHER PUBLICATIONS

International Search Report based on application No. PCT/EP2016/075227 (6 pages + 3 pages English translation) dated Feb. 3, 2017 (for reference purpose only).
(Continued)

*Primary Examiner* — Mohammed Shamsuzzaman
*Assistant Examiner* — Aaron J Gray
(74) *Attorney, Agent, or Firm* — Viering, Jentschura & Partner mbB

(57) ABSTRACT

In various aspects, an organic optoelectronic component and method for producing an organic optoelectronic component are described. An organic optoelectronic component may include a first electrode, an organic functional layer structure above the first electrode, a second electrode above the organic functional layer structure, an adhesive layer structure, and a protective film. The adhesive layer structure may contain a first adhesive layer above the first adhesive layer, and a second adhesive layer above the first adhesive layer. The first adhesive layer may be cured. The second adhesive layer may be adherent and elastic. The protective film may
(Continued)

be above the second adhesive layer. The protective film may contain at least one region that is at least partly separated in a lateral direction.

19 Claims, 3 Drawing Sheets

(51) Int. Cl.
| | |
|---|---|
| H01L 51/56 | (2006.01) |
| B32B 7/06 | (2019.01) |
| B32B 7/12 | (2006.01) |
| B32B 37/12 | (2006.01) |
| G09F 13/22 | (2006.01) |
| B32B 38/04 | (2006.01) |
| H01L 51/00 | (2006.01) |
| B32B 9/00 | (2006.01) |
| B32B 15/085 | (2006.01) |
| B32B 15/088 | (2006.01) |
| B32B 27/32 | (2006.01) |
| B32B 9/04 | (2006.01) |
| B32B 27/34 | (2006.01) |
| B32B 3/26 | (2006.01) |
| B32B 17/00 | (2006.01) |
| B32B 15/20 | (2006.01) |
| B32B 27/06 | (2006.01) |
| B32B 27/08 | (2006.01) |
| F21V 21/08 | (2006.01) |
| B32B 38/00 | (2006.01) |

(52) U.S. Cl.
CPC ............... *B32B 7/12* (2013.01); *B32B 9/005* (2013.01); *B32B 9/041* (2013.01); *B32B 9/045* (2013.01); *B32B 15/085* (2013.01); *B32B 15/088* (2013.01); *B32B 15/20* (2013.01); *B32B 17/00* (2013.01); *B32B 27/06* (2013.01); *B32B 27/08* (2013.01); *B32B 27/32* (2013.01); *B32B 27/322* (2013.01); *B32B 27/34* (2013.01); *B32B 37/12* (2013.01); *B32B 38/04* (2013.01); *G09F 13/22* (2013.01); *H01L 51/0024* (2013.01); *H01L 51/448* (2013.01); *H01L 51/56* (2013.01); *B32B 2037/1253* (2013.01); *B32B 2038/0076* (2013.01); *B32B 2270/00* (2013.01); *B32B 2307/41* (2013.01); *B32B 2307/412* (2013.01); *B32B 2307/414* (2013.01); *B32B 2307/51* (2013.01); *B32B 2307/54* (2013.01); *B32B 2307/7244* (2013.01); *B32B 2307/7265* (2013.01); *B32B 2307/748* (2013.01); *B32B 2310/0831* (2013.01); *B32B 2457/00* (2013.01); *B32B 2457/206* (2013.01); *F21V 21/0808* (2013.01); *H01L 2251/5361* (2013.01); *Y02E 10/549* (2013.01); *Y02P 70/521* (2015.11)

(58) Field of Classification Search
CPC . H01L 51/56; H01L 51/5237; H01L 51/5246; B32B 7/06; B32B 7/12; B32B 37/12; G09F 13/22
USPC ............... 257/40, 100, E51.02; 438/26, 118; 156/247, 714
See application file for complete search history.

(56) References Cited

U.S. PATENT DOCUMENTS

| | | | |
|---|---|---|---|
| 2011/0024790 A1* | 2/2011 | Wegleiter | H01L 33/44 357/99 |
| 2012/0091923 A1* | 4/2012 | Kastner-Jung | B60Q 3/745 315/360 |
| 2014/0065430 A1* | 3/2014 | Yamazaki | H01L 27/1214 428/426 |
| 2014/0145165 A1* | 5/2014 | Woo | H01L 51/5256 257/40 |
| 2014/0162036 A1* | 6/2014 | Marcellus | B32B 17/061 428/215 |
| 2015/0014646 A1 | 1/2015 | Kaplan et al. | |
| 2015/0228926 A1* | 8/2015 | Washio | H01L 51/5253 257/40 |
| 2015/0236294 A1 | 8/2015 | Schicktanz et al. | |
| 2016/0251191 A1 | 9/2016 | Himmelsbach et al. | |

FOREIGN PATENT DOCUMENTS

| | | |
|---|---|---|
| DE | 102004062770 A1 | 6/2006 |
| DE | 102012109161 A1 | 5/2014 |
| DE | 102012223046 A1 | 6/2014 |
| DE | 102012223159 A1 | 6/2014 |
| DE | 102014210164 A1 | 1/2015 |
| DE | 202015001060 U1 | 3/2015 |
| JP | 2008311152 A | 12/2008 |
| WO | 2015022155 A1 | 2/2015 |

OTHER PUBLICATIONS

German Search Report based on application No. 10 2015 117 932.6 (10 pages) dated Jun. 22, 2016 (for reference purpose only).

* cited by examiner

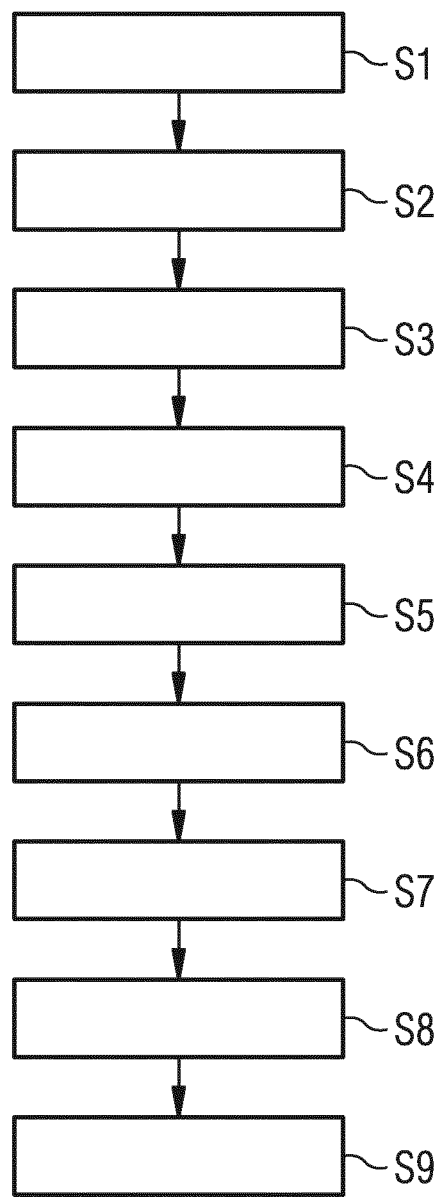

ORGANIC OPTOELECTRONIC COMPONENT AND METHOD FOR PRODUCING AN ORGANIC OPTOELECTRONIC COMPONENT

CROSS-REFERENCE TO RELATED APPLICATIONS

This patent application is a national stage entry of International Application No. PCT/EP2016/075227 under 35 U.S.C. §§ 365 and 371, filed on Oct. 20, 2016, which claims priority to German Patent Application Serial No. 10 2015 117 932.6, which was filed on Oct. 21, 2015. The disclosures of each of the foregoing documents are incorporated herein by reference in their entirety and for all purposes.

FIELD

The present disclosure relates to an organic optoelectronic component including an organic functional layer structure, and to a method for producing such an organic optoelectronic component.

BACKGROUND

Optoelectronic components which emit light can be, for example, light emitting diodes (LEDs) or organic light emitting diodes (OLEDs). An OLED may include an anode and a cathode with an organic functional layer system therebetween. The organic functional layer system may include one or a plurality of emitter layers in which electromagnetic radiation is generated, a charge generating layer structure including in each case two or more charge generating layers (CGLs) for charge generation, and one or a plurality of electron blocking layers, also referred to as hole transport layer(s) (HTL), and one or a plurality of hole blocking layers, also referred to as electron transport layer(s) (ETL), in order to direct the current flow.

Such organic optoelectronic components are usually produced and fabricated in a wafer assemblage. After the individual layers of the organic optoelectronic components have been applied on a wafer substrate, the organic optoelectronic components are singulated and dispatched to the respective customer. In order to fit the organic optoelectronic component in the desired use or application, the customer can then adhesively bond said organic optoelectronic component with a separate liquid or pressure-sensitive adhesive. However, this results in an external interface, for which precise coordination with the respective customer is necessary. Moreover, additional costs for the adhesive used can thus arise. As an alternative to adhesive bonding, the organic optoelectronic components can be clamped in the respective application. However, in the case of components including glass component parts, such a connection may be difficult to realize and/or unreliable.

SUMMARY

An aspect of the present disclosure is to specify an organic optoelectronic component which enables fitting in a desired application in a simple manner, in particular without separate component parts such as, for example, a separate adhesive layer being required by the customer for this purpose, and/or which enables a process simplification for the customer, and/or which enables a cost saving.

A further aspect of the present disclosure is to specify a method for producing an organic optoelectronic component which is implementable simply and/or cost-effectively and which enables in particular fitting of the organic optoelectronic component in a desired application in a simple manner.

In accordance with one aspect of the present disclosure, such aspect is achieved by means of an organic optoelectronic component including a first electrode, an organic functional layer structure above the first electrode, a second electrode above the organic functional layer structure, an adhesive layer structure including a first adhesive layer above the second electrode and a second adhesive layer above the first adhesive layer. The first adhesive layer is cured and the second adhesive layer is adherent and elastic. Furthermore, provision is made of a protective film above the second adhesive layer, which includes at least one region which is at least partly separated from its surroundings in a lateral direction.

The organic optoelectronic component thus contains an integrated adhesive layer structure enabling said organic optoelectronic component to be adhesively bonded in an application desired by and on the part of the customer. An integrated adhesive interface of the organic optoelectronic component is thus concomitantly delivered to the customer. An additional adhesive is thus no longer necessary on the part of the customer, as a result of which the costs overall are reduced. Moreover, the process is simplified for the customer since the adhesive layer structure has already been applied in the course of production. Furthermore, a predefined adhesive interface is made possible on the part of the organic optoelectronic component since the adhesive region provided is already predefined by the process for producing the organic optoelectronic component.

The first electrode and the second electrode are suitable for electrically contacting the organic functional layer structure. By way of example, the first electrode and the second electrode are formed in each case as an electrically conductive electrode layer or as part of an electrically conductive electrode layer.

The organic functional layer structure is configured to convert electrical energy into light or light into electrical energy. By way of example, the organic optoelectronic component is an OLED and the organic functional layer structure is an optically active region of the OLED. As an alternative thereto, the organic optoelectronic component is a solar cell, in particular an organic solar cell.

The adhesive layer structure is composed at least of the first adhesive layer and the second adhesive layer. Moreover, further adhesive layers can be provided, which are arranged between the first adhesive layer and the second adhesive layer and/or on the second adhesive layer.

The first adhesive layer is cured. This means, in particular, that a pre-crosslinking has taken place or has been carried out in the case of the first adhesive layer, for example by means of a UV method.

The second adhesive layer is adherent and elastic. Adherent should be understood to mean, in particular, that the second adhesive layer is adhesive or sticky, is distinguished by adhesiveness and/or has high cohesion forces. The second adhesive layer preferably wets the first adhesive layer. Elastic should be understood to mean, in particular, that the second adhesive layer has compliant, malleable, flexible and/or soft properties.

The protective film has at least one region which is at least partly separated from its surroundings in a lateral direction. By way of example, the region is separated from its surroundings, that is to say from the rest of the protective film, by a perforation. In this case, it is not absolutely necessary for a complete separation to be realized. In particular, it is possible for the separation to be formed spatially only in part. In a lateral direction means, in particular, in a direction of a lateral extent of the organic optoelectronic component.

The protective film is provided, in particular, for the mechanical protection of the organic functional layer structure and accordingly has protective properties. By way of example, the protective film is an aluminum film and/or some other structurable, mechanically stable film, for example a barrier film.

An encapsulation layer can be provided between second electrode and adhesive layer structure, said encapsulation layer hermetically sealing the organic functional layer structure and/or protecting it against moisture and/or mechanical influences. In this case, the adhesive layer structure, in particular the first adhesive layer, is applied directly on the encapsulation layer.

In accordance with one development, the first adhesive layer and the second adhesive layer merge into one another. In particular, no discrete interface is formed between first adhesive layer and second adhesive layer. In particular, to put it clearly, a fluid transition takes place between first adhesive layer and second adhesive layer.

An adhesive layer structure including adhesive layers merging into one another enables a uniform adhesive layer structure having, at a side facing the organic optoelectronic component, desired first properties that merge seamlessly into desired second properties at the side facing away from the organic optoelectronic component. It is thus possible to comply with different desired requirements at the opposite sides of the adhesive layer structure.

In accordance with an alternative development, the first adhesive layer and the second adhesive layer have a discrete interface with respect to one another. The adhesive layer structure thus includes individual, separate adhesive layers, between which a determinable interface is formed. In this case, the separate adhesive layers are adapted to the desired properties. By virtue of the separate adhesive layers, in each case a large material selection is made possible, in particular, which can be restricted in accordance with the respective desired properties.

In accordance with one development, the first adhesive layer includes a material, wherein the second adhesive layer includes the same material. The first adhesive layer and the second adhesive layer are accordingly formed identically with respect to their material. An adhesive layer structure including adhesive layers merging into one another is thus made possible. In this case, the adhesive layers may differ in properties such as their pre-crosslinking stage, for example, such that different properties can result for the first adhesive layer and for the second adhesive layer despite identical material.

In accordance with an alternative development, the first adhesive layer includes a material, wherein the second adhesive layer includes a different material. The first adhesive layer and the second adhesive layer accordingly differ not only in their properties but also in their material. An adhesive layer structure including separate adhesive layers that do not merge into one another is thus made possible. In this case, the material selection of the individual adhesive layers can be effected depending on the respectively desired property, which increases the possibilities in respect of desired possible properties.

In accordance with one development, the second adhesive layer has a modulus of elasticity of 1 N/mm2 to 1000 N/mm2, in particular of 10 N/mm2 to 100 N/mm2.

On account of the elastic properties and a modulus of elasticity in the stated range, in particular subsequent fitting of the organic optoelectronic component in the desired application by means of the second adhesive layer is made possible. Elastic should be understood to mean, in particular, that the second adhesive layer can react reversibly to an acting force. The modulus of elasticity in the stated range enables a desired and/or reversible deformation of the second adhesive layer for the external mechanical fitting of the organic optoelectronic component.

The aspect is furthermore achieved by means of a method for producing an organic optoelectronic component, for example the organic optoelectronic component explained above. In the method, the first electrode is formed, the organic functional layer structure is formed above the first electrode, the second electrode is formed above the organic functional layer structure, the adhesive layer structure is formed including a first adhesive layer above the second electrode and a second adhesive layer above the first adhesive layer, wherein the first adhesive layer is cured and the second adhesive layer is adherent and elastic. Furthermore, the protective film is formed above the second adhesive layer, wherein at least one region which is at least partly separated from surroundings in a lateral direction is formed in the protective film.

The method is distinguished in particular by its simple and cost-effective implementation and also by its possible fitting in a simple manner in a desired application.

Alternative embodiments and/or advantages concerning the adhesive layer structure, the organic functional layer structure, the organic optoelectronic component and/or respectively component parts thereof have already been explained further above in the application in association with the respective product and are correspondingly applied in the production method, of course, without being explicitly presented once again here.

The optoelectronic component is distinguished overall by the bipartite adhesive layer structure, which has already been pre-crosslinked at one side and does not yet actually exhibit pre-crosslinking at another side, and is therefore suitable for further adhesive bonding, for example on the part of the customer.

The region of the protective film can be separated from its surroundings for example by the protective film being structured by means of a laser. In this case, it is possible for the protective film already to have been applied on the second adhesive layer for the purpose of structuring. Alternatively, it is possible for the structuring already to have been carried out before the protective film is applied on the second adhesive layer, for example by means of a stamping method, and then for the protective film to be applied in structured form on the second adhesive layer.

In accordance with one development, the first adhesive layer and the second adhesive layer are formed in a manner merging into one another. The adhesive layer structure is thus distinguished by an unbounded or fluid transition between the individual adhesive layers. A discrete interface between the adhesive layers is not formed in this case. An adhesive layer structure having a homogeneous appearance is thus made possible.

In accordance with one development, the first adhesive layer and the second adhesive layer are formed in a manner having a discrete interface with respect to one another. The adhesive layers are thus formed as two layers separated from one another and arranged one directly above the other. A large material selection corresponding to the desired properties of the individual adhesive layers is thus made possible.

In accordance with one development, the first adhesive layer includes a material and the second adhesive layer includes the same material. In this case, the adhesive layers are preferably formed in a manner merging fluidically into one another, as a result of which an adhesive layer structure having homogeneous properties can be produced.

In accordance with one development, the first adhesive layer includes a material and the second adhesive layer includes a different material. In this case, the adhesive layers are preferably separated from one another by a discrete interface. In this case, the material selection of the individual adhesive layers is preferably dependent on the individual, possibly different requirements regarding the respective desired properties.

In accordance with one development, the first adhesive layer is pre-crosslinked for the purpose of curing with radiation in the ultraviolet wavelength range. In this case, the second adhesive layer is preferably not or at least not completely or hardly pre-crosslinked. In this case, the method step of pre-crosslinking preferably takes place before the protective film is applied. After the pre-crosslinking, the protective film is then adhesively bonded onto the second adhesive layer, which then adheres on this layer and affords a mechanical protection of the underlying layers.

The adhesive layer structure includes adhesive layers that cure in two stages for the purpose of pre-crosslinking, inter alia; by way of example, the first adhesive layer and the second adhesive layer are composed of an acrylic adhesive.

In accordance with one development, the region of the protective film is pulled off the second adhesive layer. By virtue of the lateral separation of the region from its surroundings, for example by means of perforation and/or by structuring by means of a laser method and/or by an envisaged stamping method, it is possible for the region of the protective film to be pulled off without problems and without detaching the surroundings of the protective film. In this case, by way of example the protective film is structured in such a way that it can be pulled off for example in an edge region of the organic optoelectronic component.

The protective film is thus pulled off in the provided and predefined region by the customer, for example, this giving rise to an exposed surface of the second adhesive layer in the region pulled off, which the customer can utilize and use for fitting or adhesively bonding the organic optoelectronic component in the desired application. Simple mounting of the organic optoelectronic component in its application without additional required component parts is thus made possible.

In accordance with one development, the second adhesive layer is post-cured. In this case, the post-curing preferably takes place after the adhesive bonding of the optoelectronic component in its application. The complete post-curing can for example be activated by a thermal step and/or be effected by UV radiation.

BRIEF DESCRIPTION OF THE DRAWINGS

Embodiments of the present disclosure are illustrated in the drawings and are explained in greater detail below.

In the drawings:

FIG. 4 shows a flow diagram concerning the method for producing the embodiment of the organic optoelectronic component from FIG. 2.

DETAILED DESCRIPTION

Figure 1:
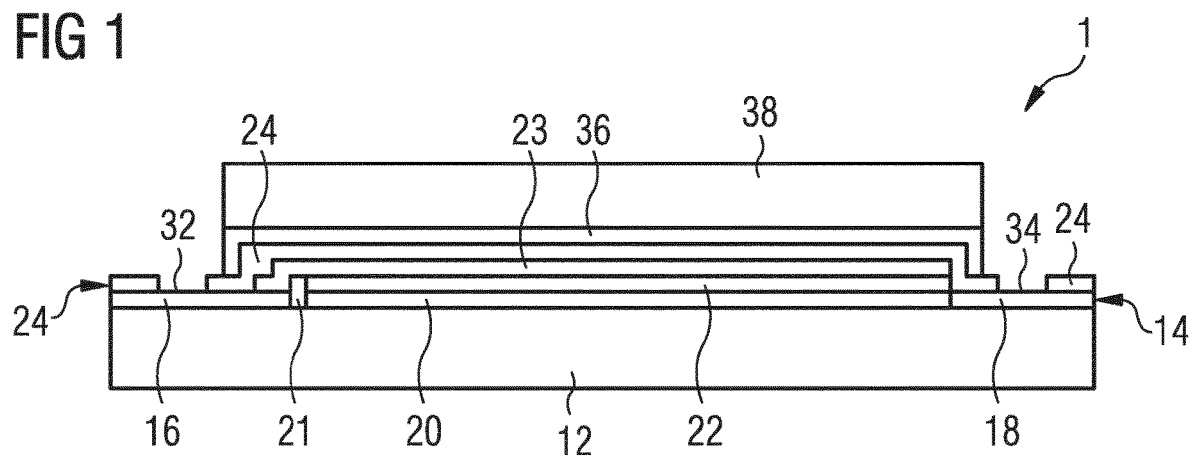
FIG. 1 shows a lateral sectional illustration of an organic optoelectronic component.

In the following detailed description, reference is made to the accompanying drawings, which form part of this description and show for illustration purposes specific embodiments in which the present disclosure can be implemented. In this regard, direction terminology such as, for instance, "at the top", "at the bottom", "at the front", "at the back", "front", "rear", etc. is used with respect to the orientation of the FIG(s). described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined herein and all changes which come within the meaning and range of equivalency of the present disclosure are intended to be embraced.

In the context of this description, the terms "connected" and "coupled" are used to describe both a direct and an indirect connection and a direct or indirect coupling. In the drawings, identical or similar elements are provided with identical reference signs, insofar as this is expedient.

An organic optoelectronic component can be an organic electromagnetic radiation emitting component or an organic electromagnetic radiation absorbing component. An organic electromagnetic radiation absorbing component can be, for example, an organic solar cell or an organic photocell. In various embodiments, an organic electromagnetic radiation emitting component can be formed as an organic electromagnetic radiation emitting diode (organic light emitting diode, OLED) or as an organic electromagnetic radiation emitting transistor. The radiation can be, for example, light in the visible range, UV light and/or infrared light. In various embodiments, the organic light emitting component can be part of an integrated circuit. Furthermore, a plurality of organic light emitting components can be provided, for example in a manner accommodated in a common housing.

FIG. 1 shows an organic optoelectronic component 1. The organic optoelectronic component 1 includes a carrier 12. The carrier 12 can be formed as translucent or transparent. The carrier 12 serves as a carrier element for electronic elements or layers, for example light emitting elements. The carrier 12 may include or be formed from, for example, plastic, metal, glass, quartz and/or a semiconductor material. Furthermore, the carrier 12 may include or be formed from one plastics film or a laminate including one or including a plurality of plastics films. The carrier 12 can be formed as mechanically rigid or mechanically flexible.

An optoelectronic layer structure is formed on the carrier 12. The optoelectronic layer structure includes a first electrode layer 14, which includes a first contact section 16, a second contact section 18 and a first electrode 20. The carrier 12 with the first electrode layer 14 can also be referred to as a substrate. A first barrier layer (not illustrated), for example a first barrier thin-film layer, can be formed between the carrier 12 and the first electrode layer 14.

The first electrode 20 is electrically insulated from the first contact section 16 by means of an electrical insulation barrier 21. The second contact section 18 is electrically coupled to the first electrode 20 of the optoelectronic layer structure. The first electrode 20 can be formed as an anode or as a cathode. The first electrode 20 can be formed as translucent or transparent. The first electrode 20 includes an electrically conductive material, for example metal and/or a transparent conductive oxide (TCO) or a layer stack of a plurality of layers including metals or TCOs. The first electrode 20 may include for example a layer stack of a combination of a layer of a metal on a layer of a TCO, or vice versa. One example is a silver (Ag) layer applied on an indium tin oxide (ITO) layer (Ag on ITO) or ITO-Ag-ITO multilayers. As an alternative or in addition to the materials mentioned, the first electrode 20 may include: networks composed of metallic nanowires and nanoparticles, for example composed of Ag, networks composed of carbon nanotubes, graphene particles and graphene layers and/or networks composed of semiconducting nanowires.

An optically functional layer structure, for example an organic functional layer structure 22, of the optoelectronic layer structure is formed above the first electrode 20. The organic functional layer structure 22 may include for example one, two or more partial layers. By way of example, the organic functional layer structure 22 may include a hole injection layer, a hole transport layer, an emitter layer, an electron transport layer and/or an electron injection layer. The hole injection layer serves for reducing the band gap between first electrode and hole transport layer. In the case of the hole transport layer, the hole conductivity is greater than the electron conductivity. The hole transport layer serves for transporting the holes. In the case of the electron transport layer, the electron conductivity is greater than the hole conductivity. The electron transport layer serves for transporting the electrons. The electron injection layer serves for reducing the band gap between second electrode and electron transport layer. Furthermore, the organic functional layer structure 22 may include one, two or more functional layer structure units each including the partial layers mentioned and/or further intermediate layers.

A second electrode 23 of the optoelectronic layer structure is formed above the organic functional layer structure 22, said second electrode being electrically coupled to the first contact section 16. The second electrode 23 can be formed in accordance with one of the configurations of the first electrode 20, wherein the first electrode 20 and the second electrode 23 can be formed identically or differently. The first electrode 20 serves for example as an anode or a cathode of the optoelectronic layer structure. The second electrode 23, in a manner corresponding to the first electrode, serves as a cathode or respectively an anode of the optoelectronic layer structure.

The optoelectronic layer structure is an electrically and/or optically active region. The active region is, for example, that region of the optoelectronic component in which electric current for the operation of the optoelectronic component flows and/or in which electromagnetic radiation is generated or absorbed. A getter structure (not illustrated) can be arranged on or above the active region. The getter layer can be formed as translucent, transparent or opaque. The getter layer may include or be formed from a material which absorbs and binds substances that are harmful to the active region.

An encapsulation layer 24 of the optoelectronic layer structure is formed above the second electrode 23 and in part above the first contact section 16 and, in part, above the second contact section 18, and encapsulates the optoelectronic layer structure. The encapsulation layer 24 can be formed as a second barrier layer, for example as a second barrier thin-film layer. The encapsulation layer 24 can also be referred to as thin film encapsulation. The encapsulation layer 24 forms a barrier vis-à-vis chemical contaminants and/or atmospheric substances, in particular vis-à-vis water (moisture) and oxygen. The encapsulation layer 24 can be formed as a single layer, a layer stack or a layer structure. The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), Nylon 66, and mixtures and alloys thereof. If appropriate, the first barrier layer can be formed on the carrier 12 in a manner corresponding to a configuration of the encapsulation layer 24.

In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24. The first contact region 32 serves for electrically contacting the first contact section 16 and the second contact region 34 serves for electrically contacting the second contact section 18.

An adhesive layer 36 is formed above the encapsulation layer 24. The adhesive layer 36 includes for example an adhesion medium, for example an adhesive, for example a lamination adhesive, a lacquer and/or a resin. The adhesive layer 36 may include for example particles which scatter electromagnetic radiation, for example light scattering particles.

A protective film 38 is formed above the adhesive layer 36. The adhesive layer 36 serves for securing the protective film 38 to the encapsulation layer 24. The protective film 38 includes plastic and/or metal, for example. By way of example, the protective film 38 may substantially be formed from glass and include a thin metal layer, for example a metal film, and/or a graphite layer, for example a graphite laminate, on the glass body. The protective film 38 serves for protecting the optoelectronic component 1, for example against mechanical force influences from outside. Furthermore, the protective film 38 can serve for distributing and/or dissipating heat that is generated in the optoelectronic component 1. By way of example, the glass of the protective film 38 can serve as protection against external influences and the metal layer of the protective film 38 can serve for distributing and/or dissipating the heat that arises during the operation of the optoelectronic component 1.

Figure 2:
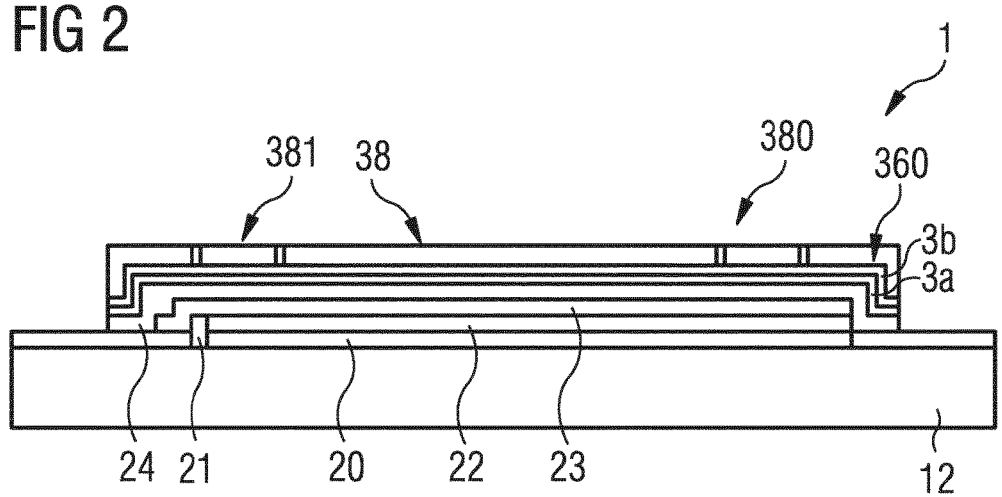
FIG. 2 shows a lateral sectional illustration of one embodiment of an organic optoelectronic component.

FIG. 2 shows one embodiment of an organic optoelectronic component 1, which, for example, can largely correspond to the organic optoelectronic component 1 shown in FIG. 1. The organic optoelectronic component 1 includes on the carrier 12, which is formed in particular as a glass substrate, the first electrode 20, which is in particular a TCO layer and serves in particular as an anode, the organic functional layer structure 22 on the first electrode 20, the second electrode 23 on the organic functional layer structure 22, which serves in particular as a cathode, an encapsulation layer 24, which is in particular a TFE layer, on the second electrode 23, an adhesive layer structure 360 on the encapsulation layer 24, and the protective film 38.

The carrier 12 serves as a carrier element for the further layers arranged thereon.

The organic functional layer structure 22 may include one, two or more partial layers. By way of example, the organic functional layer structure 22 may include the hole injection layer, the hole transport layer, the emitter layer, the electron transport layer and/or the electron injection layer. The hole injection layer serves for reducing the band gap between first electrode and hole transport layer. In the case of the hole transport layer, the hole conductivity is greater than the electron conductivity. The hole transport layer serves for transporting the holes. In the case of the electron transport layer, the electron conductivity is greater than the hole conductivity. The electron transport layer serves for transporting the holes. The electron injection layer serves for reducing the band gap between second electrode and electron transport layer. Furthermore, the organic functional layer structure 22 may include one, two or more functional layer structure units each including the partial layers mentioned and/or further intermediate layers.

The encapsulation layer 24 can be formed as a barrier layer, for example as a barrier thin-film layer. The encapsulation layer 24 can also be referred to as thin film encapsulation. The encapsulation layer 24 forms a barrier vis-à-vis chemical contaminants and/or atmospheric substances, in particular vis-à-vis water (moisture) and oxygen. The encapsulation layer 24 can be formed as a single layer, a layer stack or a layer structure. The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), Nylon 66, and mixtures and alloys thereof or tetrafluoroethylene (TFE).

The adhesive layer structure 360 serves for securing the protective film 38 on the encapsulation layer 24. For this purpose, the adhesive layer structure 360 includes a first adhesive layer 3a above the encapsulation layer 24 and a second adhesive layer 3b above the first adhesive layer 3a. The first adhesive layer 3a is cured and pre-crosslinked for example by means of UV radiation. The second adhesive layer 3b is adherent and elastic. By way of example, the second adhesive layer 3b has a modulus of elasticity in a range of 1 N/mm2 to 1000 N/mm2, in particular of 10 N/mm2 to 100 N/mm2. To put it clearly, the first and the second adhesive layers 3a, 3b have a transition ranging fluidically into one another, such that no discrete interface is formed between the individual adhesive layers 3a, 3b. By way of example, for this purpose, the adhesive layers 3a, 3b include the same material and are preferably an adhesive that cures in two stages, for example an acrylic adhesive.

The protective film 38 serves for protecting the organic optoelectronic component 1, for example against mechanical force influences from outside. Furthermore, the protective film 38 can serve for distributing and/or dissipating heat that is generated in the organic optoelectronic component 1. The protective film 38 may include or be in particular a metal layer or a metal film, for example an aluminum film.

The protective film 38 has a plurality of regions 380, 381, which are in each case at least partly separated laterally from their surroundings. For this purpose, the protective film 38 is structured, for example by means of a laser method or a stamping method, and has perforated lines, for example. The protective film 38 is adhesively bonded directly on the second adhesive layer 3b. On account of its structuring, however, the protective film 38 can be pulled off again in the regions 380, 381, which are situated for example in an edge region of the optoelectronic component 1. This enables the regions 380, 381 to be pulled off directly by the customer and the latter can obtain and use thereby exposed surfaces of the second adhesive layer 3b for adhesively bonding the optoelectronic component 1 in a desired application.

As an alternative to the embodiment discussed above, the protective film can also be some other structurable, mechanical film, for example a barrier film or a plastics film, for example a PE film (PE: polyethylene).

As a further alternative, the first adhesive layer and the second adhesive layer can have a discrete interface, for example on account of different materials of the first adhesive layer and the second adhesive layer. Moreover, the adhesive layer structure may include further adhesive layers, which are arranged for example between the first adhesive layer and the second adhesive layer.

Figure 3A:
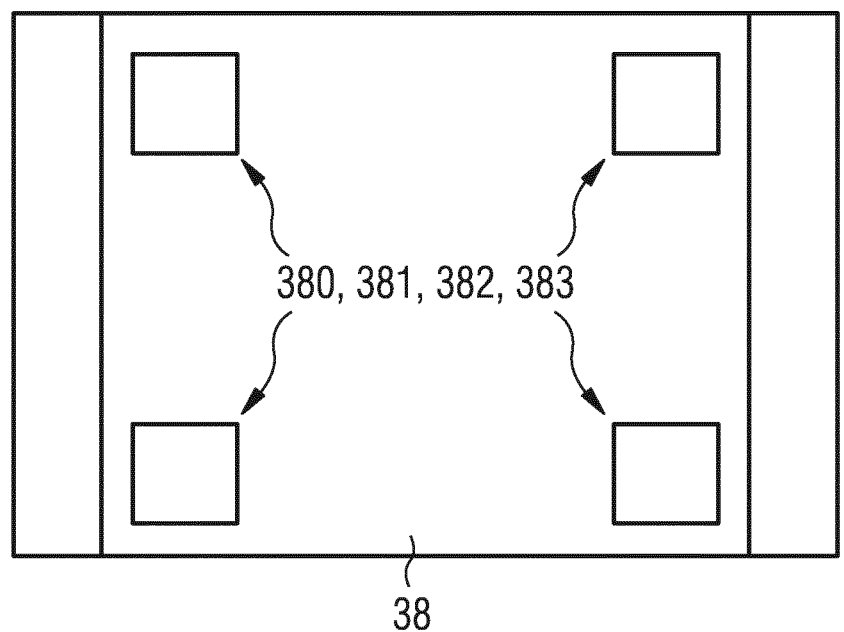
FIG. 3A shows a plan view of the embodiment of the organic optoelectronic component from FIG. 2 after production.

FIG. 3A shows the embodiment of the organic optoelectronic component 1 from FIG. 2 in a plan view of the organic optoelectronic component 1. The protective film 38 has in particular four regions 380, 381, 382, 383 arranged in the edge region of the optoelectronic component 1, said regions being separated from their surroundings by laser structuring. In the embodiment in FIG. 3A, the regions 380, 381, 382, 383 of the protective film 38 have not yet been detached or removed from the optoelectronic component 1. The optoelectronic component 1, as shown in the embodiment in FIG. 3A, is delivered to the customer for installation of the optoelectronic component 1 in a desired application.

Figure 3B:
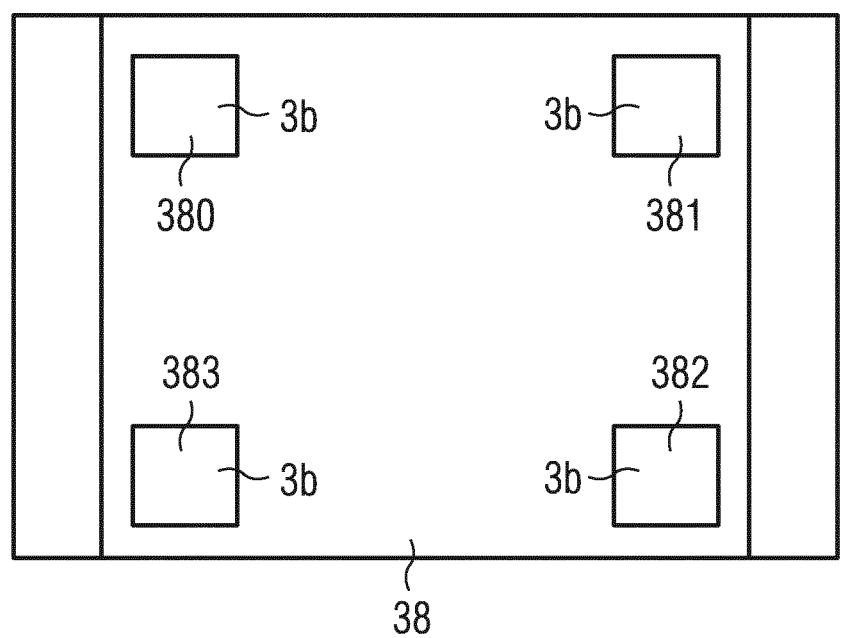
FIG. 3B shows a plan view of the embodiment of the organic optoelectronic component from FIG. 2 in the possession of the customer before adhesive bonding in the desired application.

FIG. 3B shows the embodiment of the organic optoelectronic component 1 from FIG. 2 in a plan view of the organic optoelectronic component 1 in the possession of the customer. For the purpose of adhesively bonding the optoelectronic component 1 in its desired application, the regions 380, 381, 382, 383 are removed from the optoelectronic component 1, such that exposed surfaces of the second adhesive layer 3b are present here. The exposed surfaces have adherent and adhesive properties, such that it thereby becomes possible to secure the optoelectronic component in the desired application. For this purpose, the second adhesive layer 3b is thermally post-cured by the customer, for example, such that a complete curing of the adhesive layer structure is produced.

FIG. 4 shows a flow diagram for producing the embodiment of the organic optoelectronic component 1 from FIGS. 2, 3A and 3B. Overall, six steps S1 to S6 take place which are carried out with regard to the method for producing the optoelectronic component.

A further three steps S7 to S9 take place on the part of the customer for adhesively bonding the optoelectronic component in its desired application.

In step S1, a conventionally known OLED coating takes place.

In step S2, an acrylic adhesive layer structure is applied on the OLED by a slot die coater, for example. In this case, the adhesive layer structure includes the first adhesive layer and the second adhesive layer.

In step S3, an activation of the pre-crosslinking of the adhesive layer structure takes place, for example by means of UV radiation or thermally.

In step S4, the protective film is laminated onto the second adhesive layer. In this case, a sufficient adhesion of the protective film on the second adhesive layer already takes place by virtue of the pre-activation of the pre-crosslinking.

In step S5, the protective film is pre-structured, for example by a laser method, thus giving rise to the regions which are at least partly separated from their surroundings. Alternatively, a pre-perforated protective film may already be laminated onto the second adhesive layer.

In step S6, the optoelectronic component produced is tested (final testing) and then delivered to the customer.

In step S7, which is already carried out by the customer, the customer removes the pre-structured regions of the protective film.

In step S8, the optoelectronic component is adhesively bonded in the application, in particular at the exposed regions of the second adhesive layer.

In step S9, the final curing of the adhesive layer structure takes place for example by means of a thermal process or a drying process.

The present disclosure is not restricted to the embodiments specified. By way of example, the organic optoelectronic component 1, in particular the organic functional layer structure 22, can be formed in a segmented fashion. Alternatively or additionally, a plurality of organic optoelectronic components 1 can be arranged alongside one another to form an organic optoelectronic assembly.

LIST OF REFERENCE SIGNS

Organic optoelectronic component 1
First adhesive layer 3a
Second adhesive layer 3b
Carrier 12
First electrode layer 14
First contact section 16
Second contact section 18
First electrode 20
Insulation barrier 21
Organic functional layer structure 22
Second electrode 23
Encapsulation layer 24
First contact region 32
Second contact region 34
Adhesion-medium layer 36
Protective film 38
Adhesive layer structure 360
Regions 380, 381, 382, 383
Steps S1 to S9

The invention claimed is:

1. An organic optoelectronic component comprising:
a first electrode;
an insulator configured to insulate the first electrode;
an organic functional layer structure above the first electrode;
a second electrode above the organic functional layer structure;
an encapsulation layer above the second electrode,
wherein the encapsulation layer is configured to protect the organic functional layer structure from moisture;
an adhesive layer structure including
a first adhesive layer above the encapsulation layer and a second adhesive layer above the first adhesive layer, wherein the first adhesive layer is cured, and the second adhesive layer is adherent and elastic; and
a protective film above the second adhesive layer, wherein the protective film includes a region that is partly separated from a further region of the protective film or completely separated from the further region of the protective film, and
wherein the region of the protective film is configured to be completely detached from the second adhesive layer and the further region of the protective film.

2. The organic optoelectronic component of claim 1, wherein the first adhesive layer and the second adhesive layer are integrally formed.

3. The organic optoelectronic component of claim 1, wherein the first adhesive layer and the second adhesive layer have a discrete interface therebetween.

4. The organic optoelectronic component of claim 1, wherein the first adhesive layer comprises a first material and the second adhesive layer comprises a second material, and
wherein the first material and the second material are the same material.

5. The organic optoelectronic component of claim 1, wherein the first adhesive layer comprises a first material and the second adhesive layer comprises a second material, and
wherein the first material and the second material are different materials.

6. The organic optoelectronic component of claim 1, wherein the second adhesive layer has a modulus of elasticity of 1 $N/mm^2$ to 1000 $N/mm^2$.

7. A method for producing an organic optoelectronic component, the method comprising:
forming a first electrode;
forming an insulator,
wherein the insulator is configured to insulate the first electrode;
forming an organic functional layer structure above the first electrode;
forming a second electrode above the organic functional layer structure;
forming an encapsulation layer above the second electrode,
wherein the encapsulation layer is configured to protect the organic functional layer structure from moisture;
forming an adhesive layer structure, the adhesive layer structure including
a first adhesive layer above the encapsulation layer and a second adhesive layer above the first adhesive layer, wherein the first adhesive layer is cured, and the second adhesive layer is adherent and elastic; and
arranging a protective film above the second adhesive layer,
wherein the protective film includes a region that is partly separated from a further region of the protective film or completely separated from the further region of the protective film, and
wherein the region of the protective film is configured to be completely detached from the second adhesive layer and from the further region of the protective film.

8. The method of claim 7,
wherein forming the adhesive layer structure comprises:
forming the adhesive layer structure, such that the first adhesive layer and the second adhesive layer are integrally formed.

9. The method of claim 7,
wherein forming the adhesive layer structure comprises:
forming the adhesive layer structure, such that the first adhesive layer and the second adhesive layer have a discrete interface therebetween.

10. The method of claim 7,
wherein the first adhesive layer comprises a first material and the second adhesive layer comprises a second material, and
wherein the first material and the second material are the same material.

11. The method of claim 7,
wherein the first adhesive layer comprises a first material and the second adhesive layer comprises a second material, and
wherein the first material and the second material are different materials.

12. The method of claim 7,
wherein the first adhesive layer is pre-crosslinked for radiation curing in the ultraviolet wavelength range.

13. The method of claim 7,
wherein the second adhesive layer is post-cured.

14. The organic optoelectronic component of claim 6,
wherein the second adhesive layer has a modulus of elasticity of 10 N/mm$^2$ to 100 N/mm$^2$.

15. The organic optoelectronic component of claim 1,
wherein the region of the protective film is partially separated from the further region of the protective film by a perforation.

16. The method of claim 7,
stamping the protective film such that the region of the protective film is partly separated from the further region of the protective film or completely separated from the further region of the protective film.

17. An organic optoelectronic component comprising:
a first electrode;
a first contact section;
an insulation barrier configured to electrically insulate the first electrode from the first contact section;
an organic functional layer structure above the first electrode;
a second electrode above the organic functional layer structure;
an encapsulation layer above the second electrode,
wherein the encapsulation layer is configured to protect the organic functional layer structure from moisture;
an adhesive layer structure including
a first adhesive layer above the encapsulation layer, and
a second adhesive layer directly above the first adhesive layer,
wherein the first adhesive layer is cured, and the second adhesive layer is adherent and elastic; and
a protective film above the second adhesive layer,
wherein the protective film includes a plurality of regions that are partly separated from a further region of the protective film or completely separated from the further region of the protective film, and
wherein the plurality of regions of the protective film are configured to be completely detached from the second adhesive layer and from the further region of the protective film.

18. The organic optoelectronic component of claim 17,
wherein the second adhesive layer is configured to adhere, in part, to a surface external to the organic optoelectronic component in response to a region of the plurality of regions of the protective film being detached from the second adhesive layer.

19. The organic optoelectronic component of claim 17,
wherein the protective film includes a glass material, and
wherein the glass material includes a metal layer.

* * * * *